US009196277B2

(12) United States Patent
Omachi

(10) Patent No.: US 9,196,277 B2
(45) Date of Patent: Nov. 24, 2015

(54) TERMINAL WITH TERMINAL BENDER HAVING STABLE BEND, WIRING MEMBER, AND HEAD SUSPENSION

(71) Applicant: NHK SPRING CO., LTD., Yokohama-shi, Kanagawa (JP)

(72) Inventor: Akira Omachi, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 40 days.

(21) Appl. No.: 13/856,094

(22) Filed: Apr. 3, 2013

(65) Prior Publication Data

US 2013/0286512 A1 Oct. 31, 2013

(30) Foreign Application Priority Data

Apr. 27, 2012 (JP) ................................ 2012-103785

(51) Int. Cl.

| | |
|---|---|
| ***G11B 5/48*** | (2006.01) |
| ***G11B 21/16*** | (2006.01) |
| ***H01R 4/00*** | (2006.01) |
| ***G01L 9/00*** | (2006.01) |
| ***H01R 12/55*** | (2011.01) |
| ***H05K 3/32*** | (2006.01) |
| ***H05K 3/40*** | (2006.01) |
| *H05K 3/30* | (2006.01) |

(52) U.S. Cl.

CPC ................ *G11B 5/4833* (2013.01); *G01L 9/00* (2013.01); *G11B 5/486* (2013.01); *G11B 5/4873* (2013.01); *H01R 4/00* (2013.01); *H01R 12/55* (2013.01); *H05K 3/326* (2013.01); *H05K 3/4092* (2013.01); *H05K 3/30* (2013.01); *H05K 2201/091* (2013.01); *H05K 2201/10083* (2013.01); *H05K 2201/10446* (2013.01)

(58) Field of Classification Search

CPC ...... G06F 21/79; G11C 11/56; G11B 5/5552; G11B 5/4853; G11B 5/486

USPC ........... 360/99.25, 245.8, 264.2, 266.3, 294.4

See application file for complete search history.

(56) References Cited

U.S. PATENT DOCUMENTS

| | | | | |
|---|---|---|---|---|
| 7,218,481 | B1 * | 5/2007 | Bennin et al. | 360/294.4 |
| 7,751,153 | B1 * | 7/2010 | Kulangara et al. | 360/294.6 |
| 8,570,688 | B1 * | 10/2013 | Hahn et al. | 360/294.4 |
| 2001/0043443 | A1 * | 11/2001 | Okamoto et al. | 360/294 |
| 2002/0089793 | A1 * | 7/2002 | Nakagawa et al. | 360/294.4 |
| 2003/0106783 | A1 * | 6/2003 | Marek et al. | 200/16 A |
| 2010/0271735 | A1 * | 10/2010 | Schreiber | 360/290 |
| 2011/0051290 | A1 * | 3/2011 | Inoue et al. | 360/244.2 |

FOREIGN PATENT DOCUMENTS

| | | |
|---|---|---|
| JP | 2002-208124 | 7/2002 |
| JP | 2010-086649 | 4/2010 |

* cited by examiner

*Primary Examiner* — Adam B Dravininkas

(74) *Attorney, Agent, or Firm* — Jordan and Hamburg LLP

(57) ABSTRACT

A terminal includes a terminal wiring part extending from a flexure and having an insulating layer and a wiring layer formed on the insulating layer, a terminal main part formed at a front end of the terminal wiring part and connected to a piezoelectric element arranged to face the terminal main part, and a terminal bender that is made of a supportive metal layer, is arranged along a part of the terminal wiring part in an extending direction thereof, and is plastically deformed to form a bend in the part of the terminal wiring part so as to bring the terminal main part closer to the piezoelectric element.

13 Claims, 9 Drawing Sheets

TERMINAL WITH TERMINAL BENDER HAVING STABLE BEND, WIRING MEMBER, AND HEAD SUSPENSION

BACKGROUND OF THE INVENTION

1. Field of the Invention

The present invention relates to a terminal connected to an electrode of a piezoelectric element, a wiring member having the terminal, and a head suspension having the wiring member.

2. Description of Related Art

Recent magnetic disk drives frequently employ a dual actuator system that uses, in addition to a voice coil motor to turn a head suspension as a whole, a piezoelectric element to minutely turn a head of the head suspension.

The piezoelectric element is arranged between a base plate and a load beam in the head suspension, and in proportion to a voltage applied thereto, deforms to precisely move the head at a front end of the load beam relative to the base plate.

To attach the piezoelectric element to the head suspension, the head suspension is generally provided with an actuator base having an opening in which the piezoelectric element is accommodated.

The head suspension has a flexure. i.e., a wiring member having a terminal that is connected to the piezoelectric element in the actuator base for power feeding. The terminal extends from the flexure along the actuator base so that a terminal main part of the terminal is positioned above the opening of the actuator base and is connected to the piezoelectric element with a conductive adhesive.

The piezoelectric element is frequently thinner than the actuator base, and when accommodated in the opening of the actuator base, creates a gap with respect to the terminal main part. The gap must be bridged by increasing the amount of the conductive adhesive to connect the terminal and piezoelectric element to each other.

The increased amount of the conductive adhesive raises costs and causes the conductive adhesive to ooze. In addition, the conductive adhesive used here is not a structural adhesive, and therefore, is inappropriate to form a bridge between the piezoelectric element and the terminal.

To deal with the problems, Japanese Unexamined Patent Application Publication No. 2002-208124 discloses a technique of forming a bend in a terminal wiring part of the terminal. The terminal wiring part extends from the flexure to the terminal main part, and the bend in the terminal wiring part brings the terminal main part closer to the piezoelectric element.

This related art, however, is unable to stabilize an angle of the bend and unable to secure parallelism between the terminal main part and the piezoelectric element, and therefore, is improper for actual use.

The flexure attached to the head suspension includes a supportive metal layer, an insulating layer formed on the supportive metal layer, and a wiring layer formed on the insulating layer. For the benefit of manufacturing, the terminal of the flexure to be connected to the piezoelectric element is preferred to have the same layered structure as the flexure.

In regard to the terminal of the flexure, the terminal wiring part is required to have low rigidity in an in-plane direction because the terminal wiring part must quickly follow deformation of the piezoelectric element to which the terminal is connected. The terminal wiring part is laid between the actuator base and the piezoelectric element and the actuator base functions as the grounding of the piezoelectric element, and therefore, the supportive metal layer of the terminal must be isolated from the actuator base to avoid a short circuit between them.

To realize the low rigidity and short-circuit prevention of the terminal, the related art removes the supportive metal layer from the terminal wiring part.

With the supportive metal layer removed, the related art bends the insulating layer (made of resin) and very thin wiring layer of the terminal wiring part to form the bend in the terminal. This is the reason why the bend of the related art is unable to stabilize a bend angle or secure parallelism between the terminal main part and the piezoelectric element.

SUMMARY OF THE INVENTION

An object of the present invention is to provide a terminal having a bend that is stable to surely connect the terminal to a piezoelectric element, a wiring member having the terminal, and a head suspension having the wiring member.

In order to accomplish the object, an aspect of the present invention provides a terminal including a terminal wiring part extending from a wiring member and including an insulating layer and a wiring layer formed on the insulating layer; a terminal main part formed at a front end of the terminal wiring part and connected to a piezoelectric element that is arranged to face the terminal main part; and a terminal bender that is made of a supportive metal layer, is arranged along a part of the terminal wiring part in an extending direction thereof, and is plastically deformed to form a bend in the part of the terminal wiring part so as to bring the terminal main part closer to the piezoelectric element.

This aspect of the present invention plastically deforms the terminal bender made of a supportive metal layer, to surely form a stable bend in the terminal wiring part.

DETAILED DESCRIPTION OF EMBODIMENTS

Embodiments of the present invention will be explained. Each embodiment provides a terminal having a terminal bender. The terminal bender is made of a supportive metal layer and is plastically deformed to form a bend in the terminal.

The terminal has a terminal wiring part that includes an insulating layer and a wiring layer formed on the insulating layer. The terminal bender is arranged along a part of the terminal wiring part in an extending direction thereof and is plastically bent to form the bend in the part of the terminal wiring part.

The terminal bender may replace the part of the terminal wiring part, or may be laid on the part of the terminal wiring part.

First Embodiment

A terminal according to the first embodiment of the present invention will be explained in detail. The terminal is provided for a flexure that is a wiring member of a head suspension.

Figure 1:
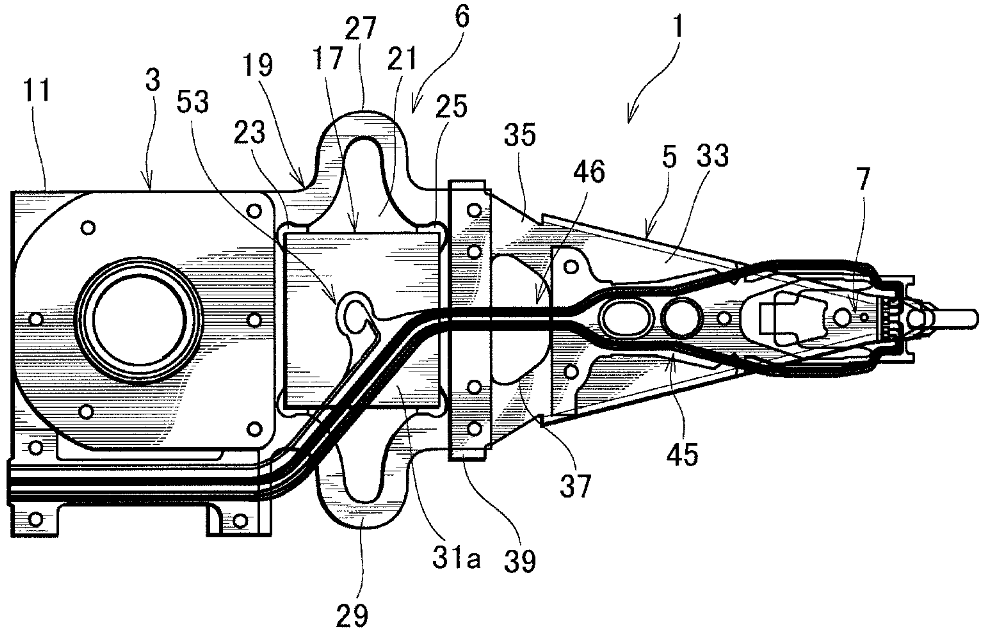
FIG. 1 is a plan view illustrating a head suspension employing a flexure provided with a terminal according to a first embodiment of the present invention.
Figure 2:
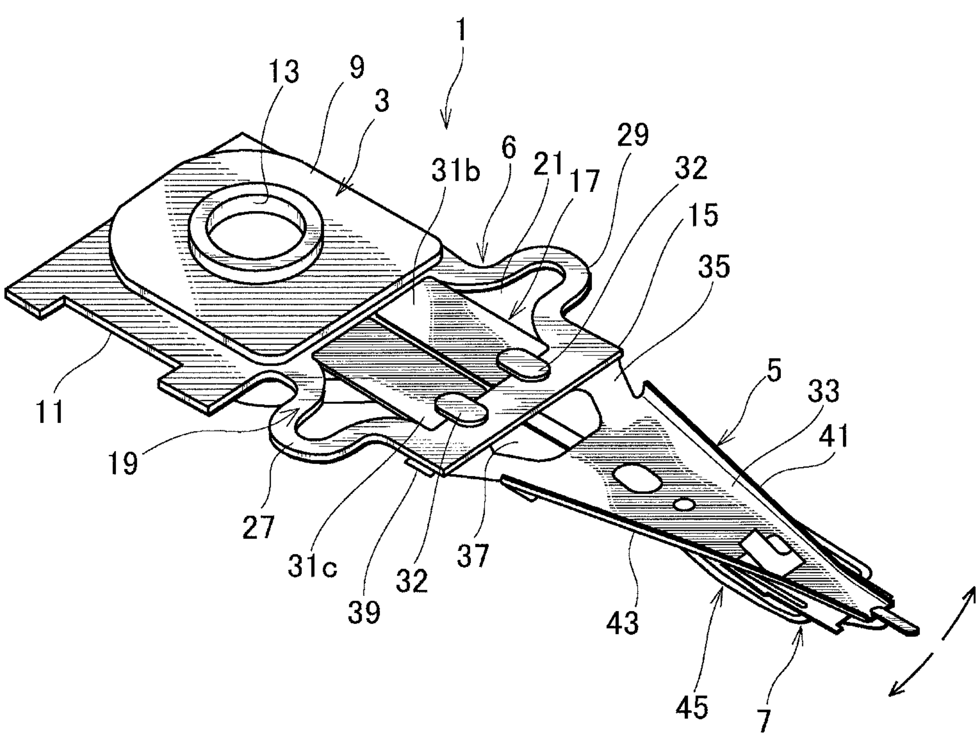
FIG. 2 is a perspective view illustrating a back side of the head suspension of FIG. 1.

FIG. 1 is a plan view illustrating the head suspension 1 employing the flexure 45 provided with the terminal 53 and FIG. 2 is a perspective view illustrating a back side of the head suspension 1.

In FIGS. 1 and 2, the head suspension 1 has a base 3, a load beam 5, and a piezoelectric actuator 6. The base 3 supports the load beam 5 through the piezoelectric actuator 6 so that the piezoelectric actuator 6 may minutely drive a head 7 at a front end of the load beam 5 in a sway direction (a width direction of the head suspension 1 indicated with arrows in FIG. 2) relative to the base 3. The head 7 is to write and read data on a magnetic disk in a disk drive of, for example, a personal computer.

The base 3 includes a base plate 9 made of conductive material such as stainless steel and a reinforcing plate 11 made of conductive material such as stainless steel. A base end area of the reinforcing plate 11 is laid on the base plate 9 and is fixed thereto by, for example, laser welding.

The base plate 9 has a boss 13 with which the head suspension 1 is attached to a carriage (not illustrated) arranged in the disk drive. The carriage is driven by a voice coil motor (not illustrated), to turn the head suspension 1 as a whole.

A front end area of the reinforcing plate 11 supports, through the piezoelectric actuator 6, the load beam 5.

The piezoelectric actuator 6 includes an actuator base 19 and a piezoelectric element 17.

The actuator base 19 is a conductive plate integral with a front end of the reinforcing plate 11. A front end of the actuator base 19 is a connection part 15 connected to the load beam 5. A middle part of the actuator base 19 forms an opening 21.

Figure 3:
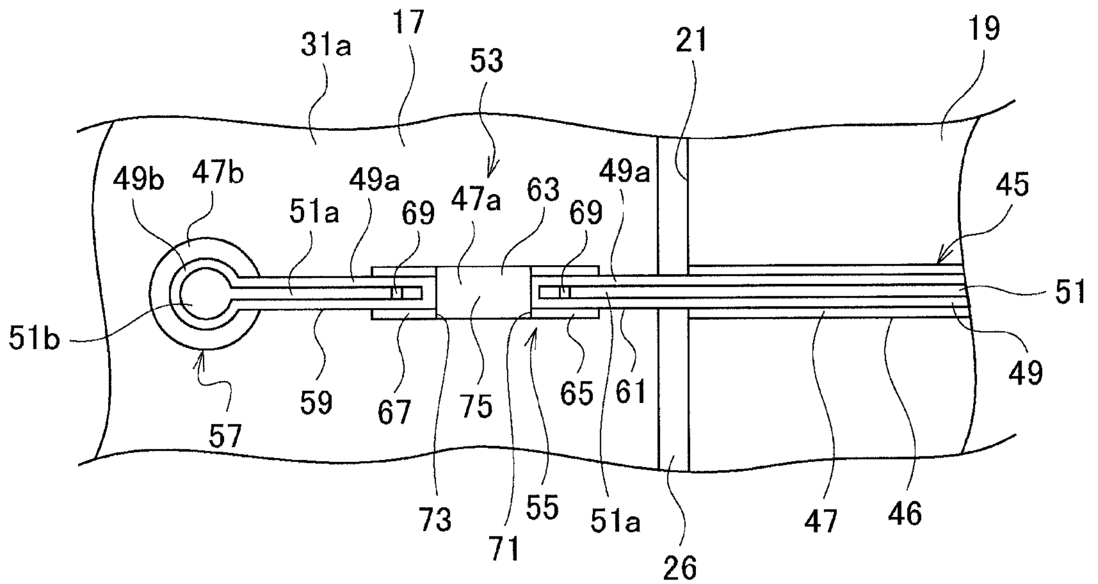
FIGS. 3 and 4 are plan and sectional views illustrating a terminal of the flexure and the periphery thereof according to the first embodiment.
Figure 4:
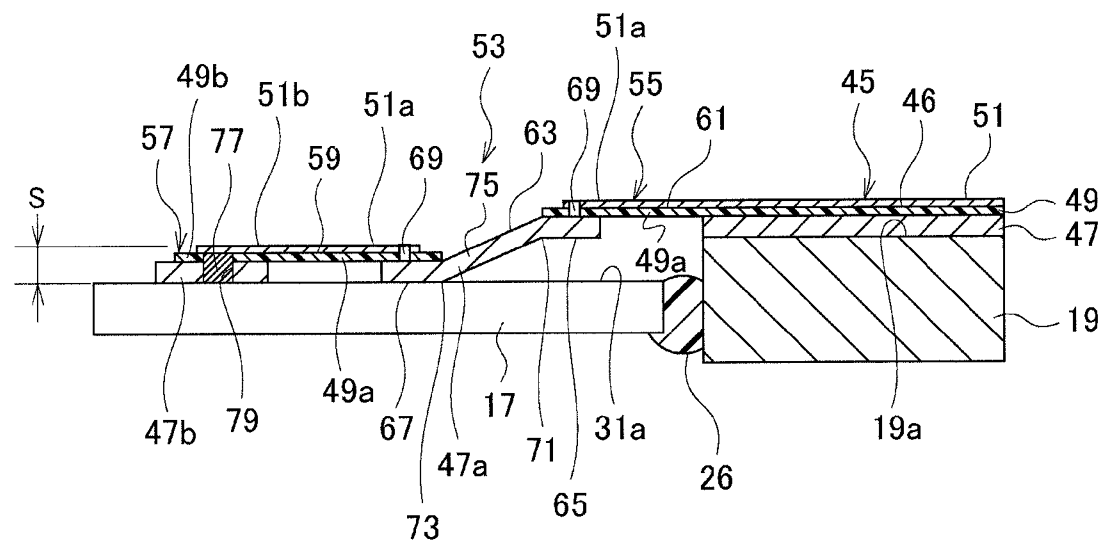

An inner circumferential face of the opening 21 is provided with fitting flanges 23 and 25 formed by, for example, etching. The piezoelectric element 17 is fixed in the opening 21 with a nonconductive adhesive 26 as illustrated in FIGS. 3 and 4. On each side of the opening 21 in the sway direction, flexible parts 27 and 29 are formed.

The piezoelectric element 17 is made of piezoelectric ceramics such as PZT (piezoelectric zirconate titanate) and has a rectangular shape. On a first surface of the piezoelectric element 17, a common electrode 31*a* is formed by gold-plating, and on a second surface thereof, a pair of electrodes 31*b* and 31*c* are formed by gold-plating.

The piezoelectric element 17 deforms according to a voltage applied through the electrodes 31*a*, 31*b*, and 31*c*, thereby minutely moving the head 7 through the load beam 5 in the sway direction with respect to the base 3.

The electrodes 31*b* and 31*c* are grounded through a conductive adhesive 32 to the actuator base 19 and the electrode 31*a* is connected to the terminal 53 of the flexure 45 to be explained later.

The load beam 5 is fixed to the connection part 15 of the actuator base 19 by, for example, laser welding and applies load onto the head 7. The load beam 5 is made of, for example, a thin stainless steel plate and includes a rigid part 33 and a resilient part 35.

The resilient part 35 is forked with a window 37 to lower bending rigidity in a thickness direction. A base end of the resilient part 35 is a connection part 39 connected to the connection part 15 of the actuator base 19.

The rigid part 33 extends from the resilient part 35 toward the front end of the load beam 5 and has rails 41 and 43 uprightly bent along each edge of the rigid part 33. The front end of the rigid part 33 supports, through the flexure 45, a slider (not illustrated) of the head 7.

The flexure 45 has a flexure main part 46 that extends along the load beam 3 and is welded to the load beam 3 by, for example, laser welding. A front end side of the flexure main part 46 supports the slider of the head 7 at a front end of the rigid part 33 of the load beam 5. A base end side of the flexure main part 46 extends toward the base 3. An intermediate area of the flexure main part 46 passes over the piezoelectric actuator 6 and has the terminal 53 connected to the electrode 31*a* of the piezoelectric element 17.

The flexure 45 and terminal 53 will be explained in detail. FIG. 3 is a plan view illustrating the terminal 53 of the flexure 45 and the periphery thereof and FIG. 4 is a sectional view illustrating the same. The flexure 45 and terminal 53 of FIGS. 3 and 4 slightly differ in shape from those of FIG. 1, for the sake of clear explanation.

In FIGS. 3 and 4, the intermediate area of the flexure main part 46 of the flexure 45 is partly positioned at an edge of the opening 21 of the actuator base 19.

The intermediate area of the flexure main part 46 includes a supportive metal layer 47 that is on the piezoelectric element 17 side, an insulating layer 49 formed on the supportive metal layer 47, and a wiring layer 51 formed on the insulating layer 49. On the wiring layer 51, a cover insulating layer (not illustrated) is formed. The cover insulating layer may be omitted.

The supportive metal layer 47 is made of a resilient conductive thin plate such as a stainless steel thin rolled plate having a thickness of, for example, about 10 to 25 micrometers.

The insulating layer 49 is made of insulating material such as polyimide and has a thickness of, for example, about 5 to 20 micrometers.

The wiring layer 51 is formed into predetermined patterns and has a thickness of, for example, about 4 to 15 micrometers. A first end of the wiring layer 51 is electrically connected to the slider of the head 7 as illustrated in FIG. 1 and a second end thereof is connected to a terminal for external connection (not illustrated).

The terminal 53 extends from the flexure main part 46 at the edge of the opening 21 toward and into the opening 21. The terminal 53 has a terminal wiring part 55 and a terminal main part 57.

The terminal wiring part 55 is continuous with the flexure main part 46. The terminal wiring part 55 is formed by partly removing the supportive metal layer 47 of the flexure main part 46 by, for example, etching. Accordingly, the terminal wiring part 55 includes an insulating layer 49*a* that is on the piezoelectric element 17 side and a wiring layer 51*a* on the insulating layer 49*a*.

With this layered structure, the terminal wiring part 55 realizes low rigidity and prevents a short circuit between the piezoelectric element 17 and the actuator base 19.

The terminal wiring part 55 according to this embodiment includes a front wiring part 59 and a rear wiring part 61 and is provided with a terminal bender 63. As illustrated in FIGS. 3 and 4, the terminal wiring part 55 is partly made of only the terminal bender 63. The terminal bender 63 is arranged along a part of the terminal wiring part 55.

As mentioned above, the terminal wiring part 55 is divided into the front wiring part 59 and rear wiring part 61. Each of the front and rear wiring parts 59 and 61 includes the insulating layer 49*a* and the wiring layer 51*a* formed on the insulating layer 49*a*. The rear wiring part 61 is integral with the flexure main part 46 and the front wiring part 59 is integral with the terminal main part 57. Between the front wiring part 59 and the rear wiring part 61, the terminal bender 63 is arranged.

The terminal bender 63 is formed by partly leaving the supportive metal layer 47 of the flexure 45 when forming the terminal wiring part 55 by partly removing the supportive metal layer 47 of the flexure 45. Namely, the terminal bender 63 is made of a rectangular supportive metal layer 47*a* and protrudes from the insulating layers 49*a* of the front wiring part 59 and rear wiring part 61 in a direction (lateral direction) orthogonal to the extending direction of the terminal wiring part 55.

A front end 67 of the terminal bender 63 is connected to a rear end of the insulating layer 49*a* of the front wiring part 59 and a rear end 65 thereof to a front end of the insulating layer 49*a* of the rear wiring part 61. The front and rear ends 67 and 65 of the terminal bender 63 are electrically connected through conductors 69 to the wiring layers 51*a* of the front wiring part 59 and rear wiring part 61, respectively.

Namely, the wiring layers 51*a* of the front wiring part 59 and rear wiring part 61 are connected through the conductors 69 passing through the insulating layers 49*a* to the front and rear ends 67 and 65 of the terminal bender 63, respectively. The conductors 69 are made by forming through holes in the wiring layers 51*a* and insulating layers 49*a* of the front wiring part 59 and rear wiring part 61 and by filling the through holes by, for example, nickel plating.

Between the rear and front ends 65 and 67 of the terminal bender 63, bends 71 and 73 are formed to form a slant 75. The bends 71 and 73 are formed by plastically deforming the terminal bender 63. The bends 71 and 73 and slant 75 bring the front end 67 of the terminal bender 63 closer to the piezoelectric element 17 than the rear end 65 of the terminal bender 63.

The terminal main part 57 is at a front end of the terminal wiring part 55 and is connected to the electrode 31*a* of the piezoelectric element 17. The piezoelectric element 17 is thinner than the actuator base 19, and therefore, the electrode 31*a* of the piezoelectric element 17 is lower in the thickness direction than a surface 19*a* of the actuator base 19.

For this, the bends 71 and 73 are formed to bring the terminal main part 57 adjacent to the piezoelectric element 17, thereby absorbing a gap or step S between the surface 19*a* of the actuator base 19 and the electrode 31*a* of the piezoelectric element 17.

The terminal main part 57 is generally circular in a plan view and has the same layered structure as the flexure main part 46. Namely, the terminal main part 57 includes a supportive metal layer 47*b* on the piezoelectric element 17 side, an insulating layer 49*b* formed on the supportive metal layer 47*b*, and a wiring layer 51*b* formed on the insulating layer 49*b*.

The terminal main part 57 is fixed to the electrode 31*a* of the piezoelectric element 17 with a conductive adhesive 77 while the supportive metal layer 47*b* of the terminal main part 57 is in contact with the electrode 31*a* of the piezoelectric element 17.

According to the embodiment, a through hole 79 is formed in the supportive metal layer 47*b* and insulating layer 49*b* of the terminal main part 57, to expose, through the through hole 79, the wiring layer 51*b* of the terminal main part 57 to the electrode 31*a* of the piezoelectric element 17.

The conductive adhesive 77 is filled in the through hole 79, to fixedly connect the wiring layer 51*b* of the terminal main part 57 to the electrode 31*a* of the piezoelectric element 17. The conductive adhesive 77 enters in a narrow gap between the supportive metal layer 47*b* of the terminal main part 57 and the electrode 31*a* of the piezoelectric element 17 and bond them together.

Figure 5:
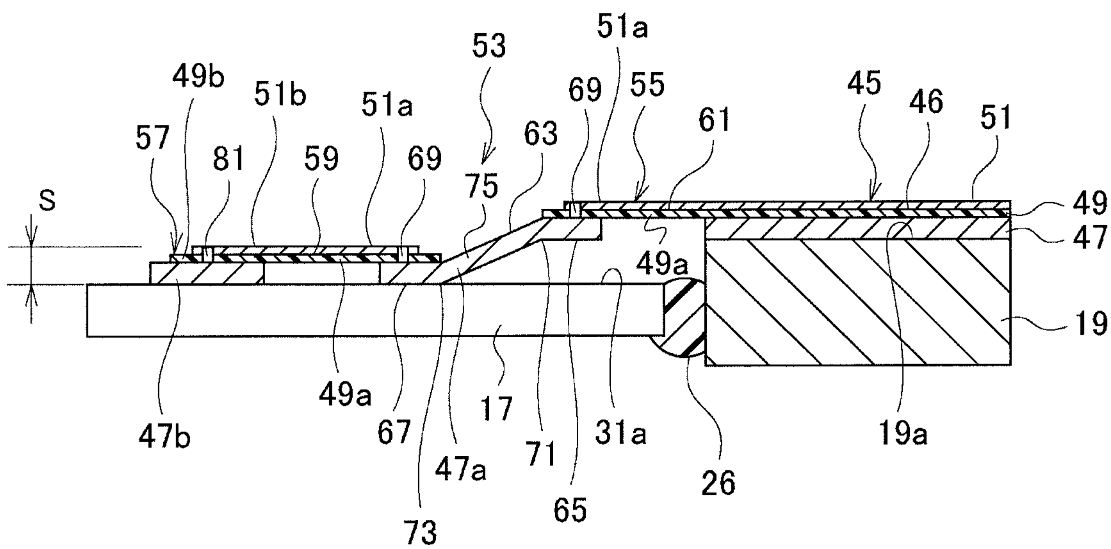
FIG. 5 is a sectional view illustrating a terminal of a flexure and the periphery thereof according to a modification of the first embodiment.

FIG. 5 is a sectional view illustrating a modification of the first embodiment of the present invention. This modification omits the through hole 79. Instead, the modification forms a conductor 81 to electrically connect the wiring layer 51*b* of the terminal main part 57 to a supportive metal layer 47*b* that is a circular plate without a hole, and with a conductive adhesive, fixes the supportive metal layer 47*b* to the electrode 31*a* of the piezoelectric element 17.

Effects of the first embodiment of the present invention will be explained.

According to the first embodiment, the terminal 53 includes the terminal wiring part 55 extending from the flexure 45 and including the insulating layer 49*a* and wiring layer 51*a* formed on the insulating layer 49*a*, the terminal main part 57 positioned at a front end of the terminal wiring part 55 and connected to the piezoelectric element 17 that is arranged to face the terminal main part 57, and the terminal bender 63 that is made of the supportive metal layer 47*a*, is arranged along a part of the terminal wiring part 55 in the extending direction of the terminal wiring part 55, and is plastically deformed to form the bends 71 and 73 in the part of the terminal wiring part 55 so as to bring the terminal main part 57 closer to the piezoelectric element 17.

The terminal bender 63 made of the supportive metal layer 47*a* is plastically deformed to surely form the bends 71 and 73 whose angles or shapes are stable so that the terminal main part 57 is surely brought adjacent to the piezoelectric element 17 and is securely fixed thereto with a reduced amount of the conductive adhesive 77.

The terminal bender 63 made of the supportive metal layer 47*a* is arranged along a part of the terminal wiring part 55, to leave the insulating layer 49*a* and wiring layer 51*a* of the terminal wiring part 55 at the front wiring part 59 and rear wiring part 61. This configuration is beneficial to surely form the bends 71 and 73 with the terminal bender 63 and reduce the rigidity of the terminal wiring part 55.

The rear wiring part 61 made of the insulating layer 49*a* and wiring layer 51*a* is positioned over the piezoelectric element 17 and actuator base 19, to surely prevent a short circuit between them.

According to the first embodiment, the terminal 53 mentioned above is provided for the flexure 45. The flexure 45 includes the flexure main part 46 that includes the supportive metal layer 47, the insulating layer 49 formed on the supportive metal layer 47, and the wiring layer 51 formed on the insulating layer 49. From the flexure main part 46, the terminal wiring part 55 of the terminal 53 extends. Namely, the terminal 53 is easily and surely formed by partially removing the supportive metal layer 47, insulating layer 49, and wiring layer 51 of the flexure main part 46.

In the flexure 45, the terminal main part 57 and piezoelectric element 17 are surely connected to each other with a reduced amount of the conductive adhesive 77, and therefore, the piezoelectric element 17 stably deforms in proportion to a voltage applied thereto from the flexure 45.

According to the first embodiment, the flexure 45 having the terminal 53 is provided for the head suspension 1. The head suspension 1 includes the base 3, the load beam 5 supported with the base 3, the flexure 45 attached to the load beam 5, the data read/write head 7 attached to the flexure 45, and the piezoelectric element 17 arranged between the base 3 and the load beam 5. According to a voltage applied from the terminal 53 of the flexure 45, the piezoelectric element 17 deforms to minutely move the head 7 through the load beam 5 in a sway direction relative to the base 3. With this configuration, the head suspension 1 is capable of stably deforming the piezoelectric element 17 and correctly move the head 7 for a very short distance.

Second Embodiment

Figure 6:
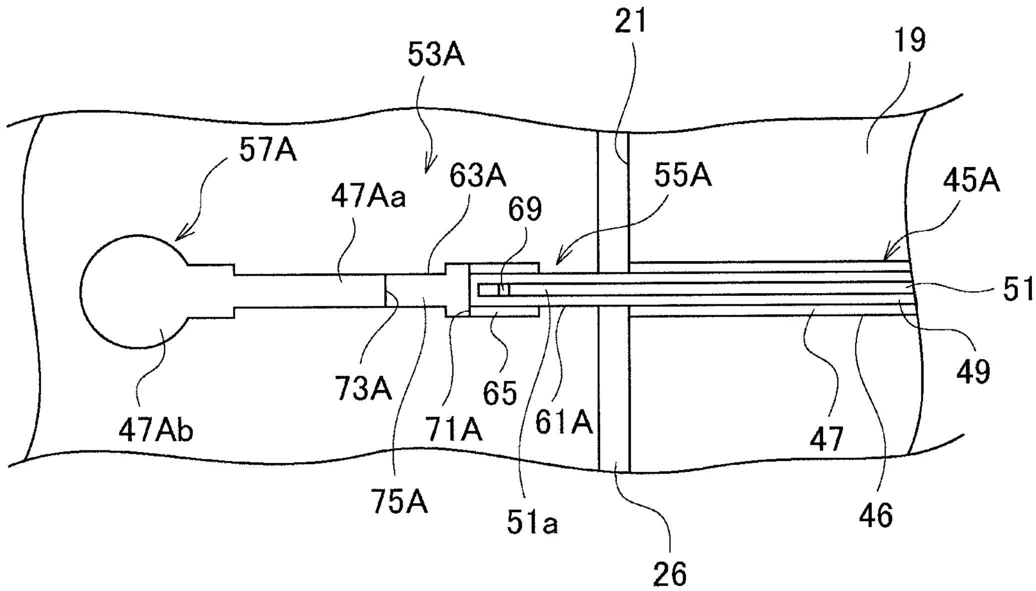
FIGS. 6 and 7 are plan and sectional views illustrating a terminal of a flexure and the periphery thereof according to a second embodiment of the present invention.
Figure 7:
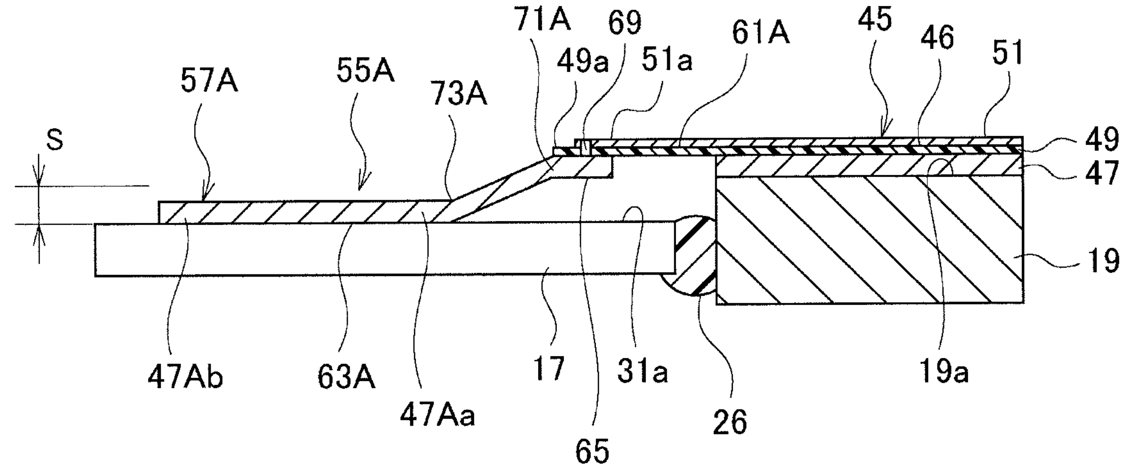

FIGS. 6 and 7 are plan and sectional views illustrating a terminal of a flexure and the periphery thereof according to the second embodiment of the present invention. The second embodiment is similar to the first embodiment, and therefore, corresponding parts are represented with like reference numerals, or like reference numerals plus "A" to omit overlapping explanations.

The terminal 53A according to the second embodiment arranges a terminal bender 63A along a terminal wiring part 55A up to a terminal main part 57A.

The second embodiment omits the front wiring part 59 of the first embodiment and forms the terminal main part 57A with the terminal bender 63A connected to a rear wiring part 61A. The rear wiring part 61A is the same as the rear wiring part 61 of the first embodiment.

Namely, the rear wiring part 61A is integral with a flexure main part 46 and includes an insulating layer 49*a* and a wiring layer 51*a* formed on the insulating layer 49*a*. A front end of the rear wiring part 61A is positioned in the middle of the terminal wiring part 55A.

The terminal bender 63A is made of a supportive metal layer 47Aa and connects the rear wiring part 61A to the terminal main part 57A. The terminal bender 63A is partly narrowed in a width direction. The width of the narrowed part of the terminal bender 63A is substantially equal to the width of the insulating layer 49*a* of the terminal wiring part 55A. The narrowed part of the terminal bender 63A may be narrower than the insulating layer 49*a* of the terminal wiring part 55A.

The terminal bender 63A is integral with a supportive metal layer 47Ab of the terminal main part 57A. Accordingly, the terminal main part 57A of this embodiment is made of only the supportive metal layer 47Ab integral with the terminal bender 63A.

The second embodiment provides effects similar to those of the first embodiment.

In addition, the second embodiment employs the terminal bender 63A to connect the rear wiring part 61A of the terminal wiring part 55A to the terminal main part 57A, to simplify the structure of a front end side of the terminal 53A.

The second embodiment forms the terminal main part 57A only with the supportive metal layer 47Ab integral with the terminal bender 63A, to further simplify the structure of the terminal 53A.

The second embodiment partly thins the terminal bender 63A, so that the terminal wiring part 55A further quickly follows deformation of the piezoelectric element 17.

Modifications of Second Embodiment

Modifications of the terminal 53A according to the second embodiment will be explained with reference to FIGS. 8 to 13.

Figure 8:
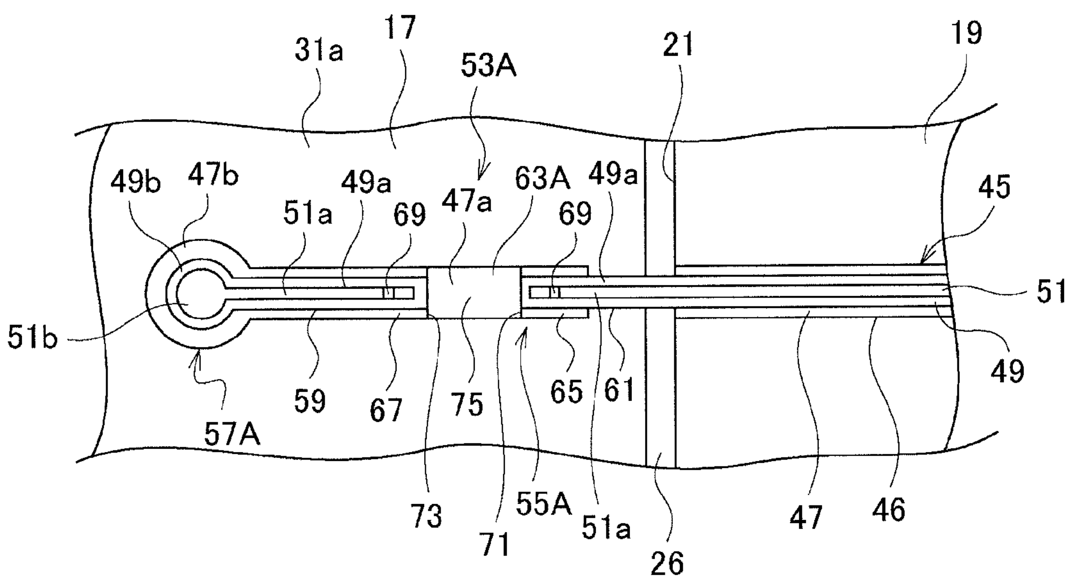
FIGS. 8 and 9 are plan and sectional views illustrating a terminal of a flexure and the periphery thereof according to a first modification of the second embodiment.
Figure 9:
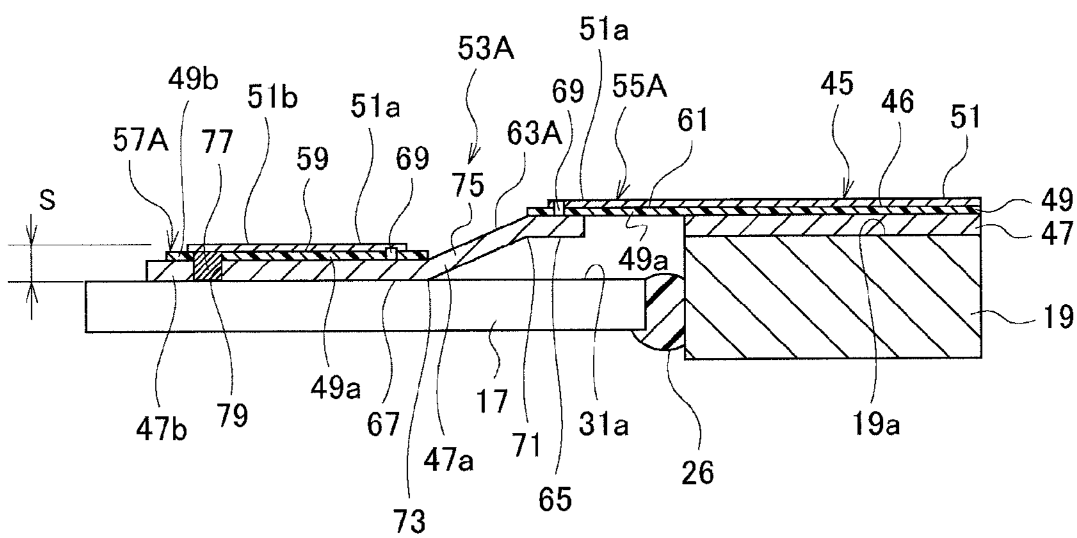

FIGS. 8 and 9 are plan and sectional views illustrating the first modification of the second embodiment. This modification arranges the terminal bender 63A along the terminal wiring part 55A up to the terminal main part 57A so that the terminal bender 63A is partly laid on the front wiring part 59A of the terminal wiring part 55A. This modification provides effects similar to those of the second embodiment.

Figure 10:
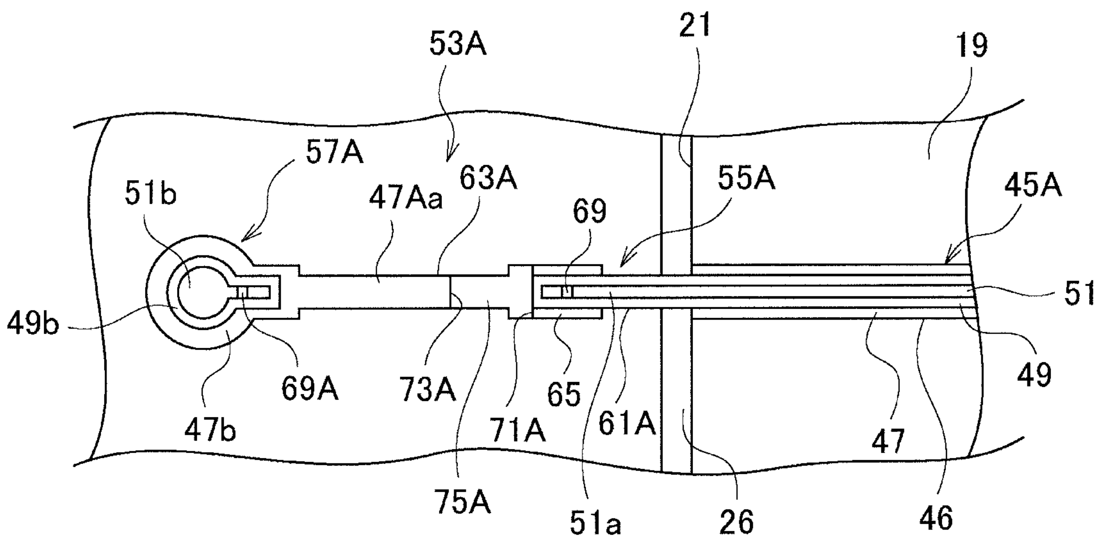
FIGS. 10 and 11 are plan and sectional views illustrating a terminal of a flexure and the periphery thereof according to a second modification of the second embodiment.
Figure 11:
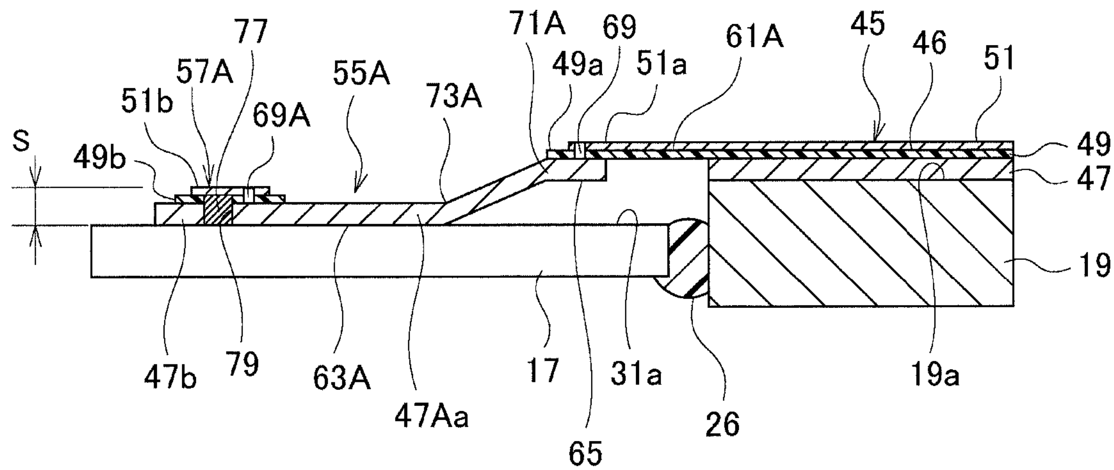

FIGS. 10 and 11 are plan and sectional views illustrating the second modification of the second embodiment. This modification provides the terminal main part 57A with the same layered structure as that of the first embodiment. Namely, the terminal main part 57A of the second modification includes the supportive metal layer 47*b* integral with the terminal bender 63A, the insulating layer 49*b* formed on the supportive metal layer 47*b*, and the wiring layer 51*b* formed on the insulating layer 49*b*. The terminal main part 57A is provided with a conductor 69A formed through the insulating layer 49*b* at a rear side of the terminal main part 57A. The conductor 69A electrically connects the wiring layer 51*b* to the terminal bender 63A. The second modification provides effects similar to those of the second embodiment.

Figure 12:
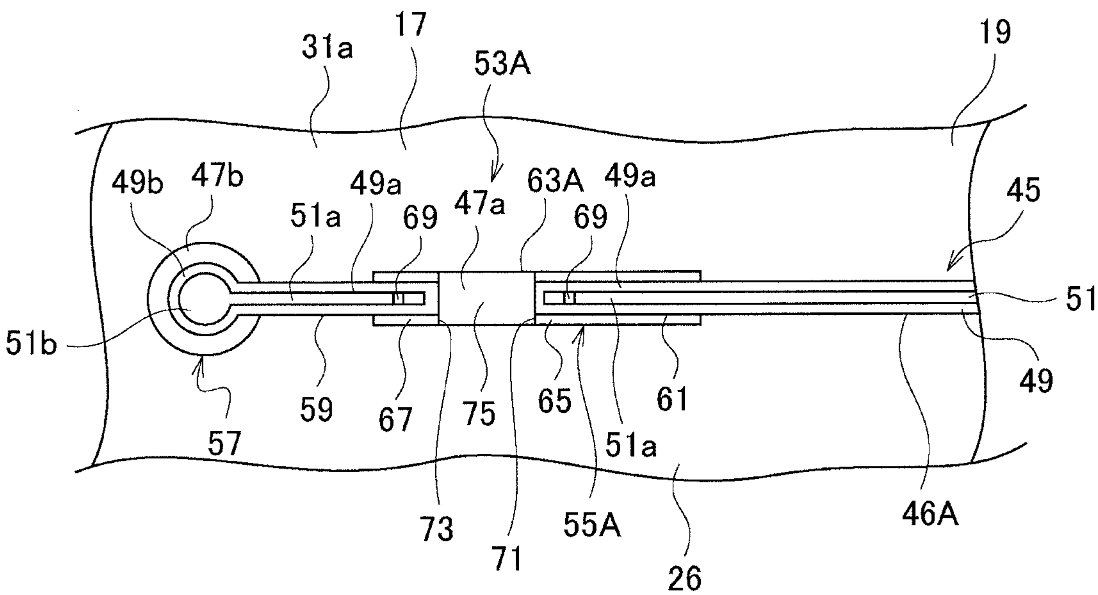
FIGS. 12 and 13 are plan and sectional views illustrating a terminal of a flexure and the periphery thereof according to a third modification of the second embodiment.
Figure 13:
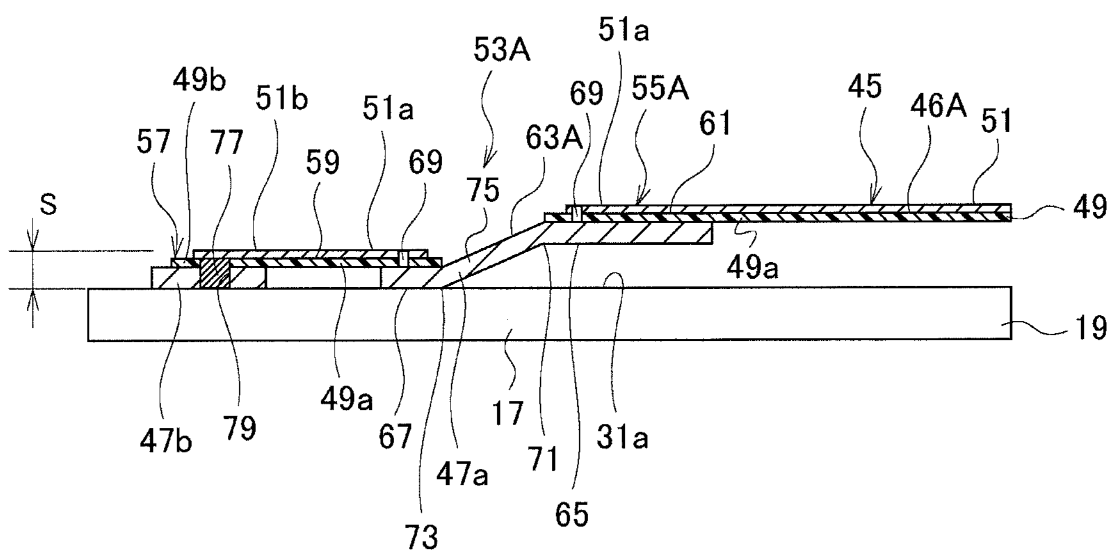

FIGS. 12 and 13 are plan and sectional views illustrating the third modification of the second embodiment. This modification arranges the terminal bender 63A up to a flexure main part 46A. This modification is applicable when an intermediate part of the flexure main part 46A passes over the piezoelectric element 17. On the piezoelectric element 17, a supportive metal layer 47 is removed from the flexure main part 46A, to prevent a short circuit. Although the terminal bender 63A is present on a rear side of the terminal wiring part 55A, this modification securely prevents a short circuit from occurring between the piezoelectric element 17 and the actuator base 19. This modification provides effects similar to those of the second embodiment.

Third Embodiment

Figure 14:
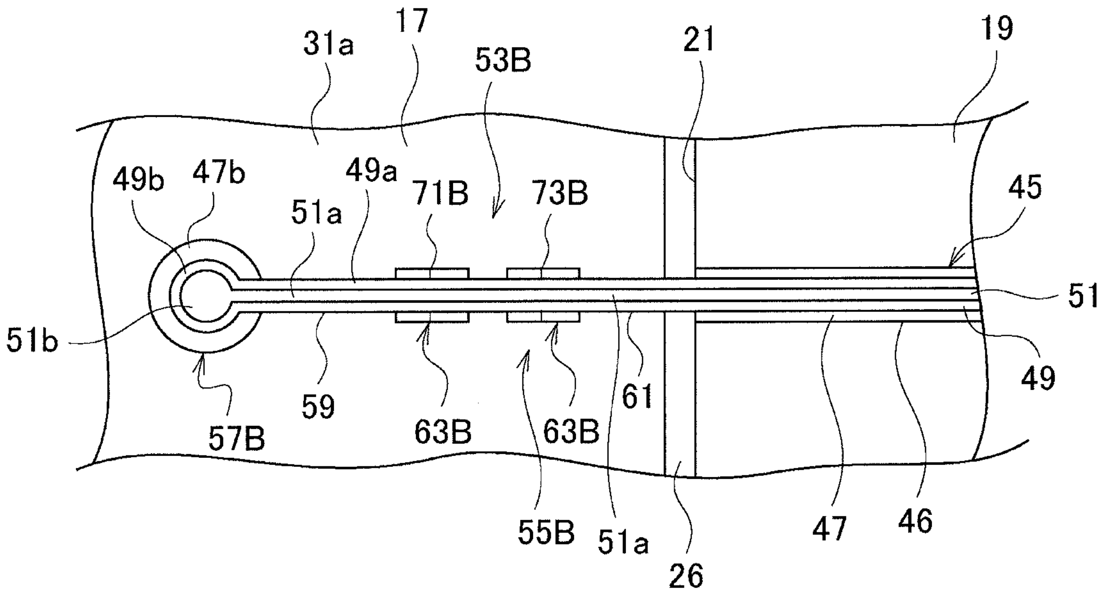
FIGS. 14 and 15 are plan and sectional views illustrating a terminal of a flexure and the periphery thereof according to a third embodiment of the present invention.
Figure 15:
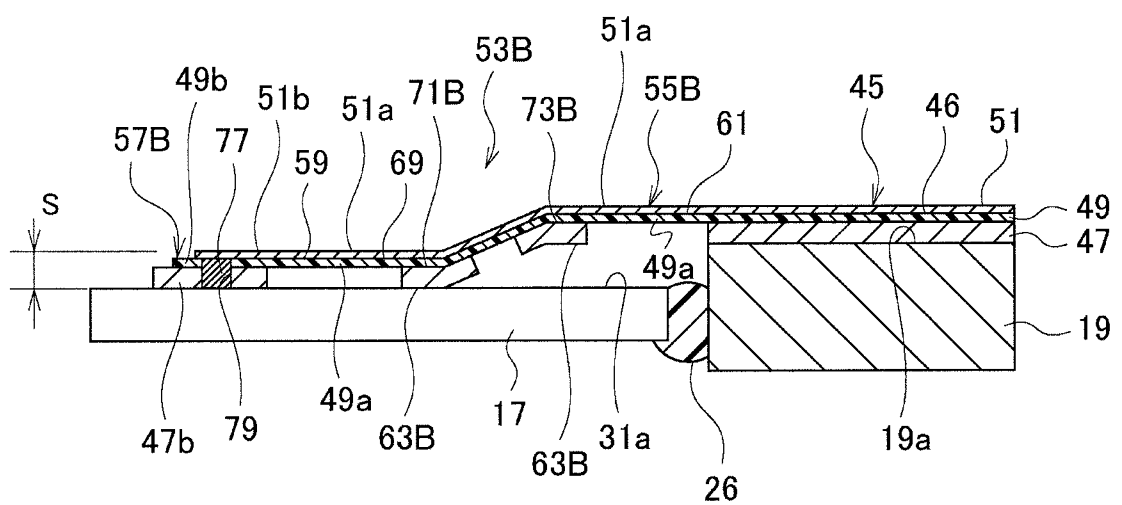

FIGS. 14 and 15 are plan and sectional views illustrating a terminal of a flexure and the periphery thereof according to the third embodiment of the present invention. The third embodiment is similar to the first embodiment, and therefore, corresponding parts are represented with like reference numerals, or like reference numerals plus "B" to omit overlapping explanations.

This embodiment arranges a pair of terminal benders 63B along a terminal wiring part 55B that includes an insulating layer 49*a* and a wiring layer 51*a*.

The terminal wiring part 55B extends from a flexure main part 46 to a terminal main part 57B and is entirely made of the insulating layer 49*a* and the wiring layer 51*a* formed on the insulating layer 49*a*. The pair of terminal benders 63B are intermittently laid along the terminal wiring part 55B.

The terminal benders 63B are plastically bent to respectively form bends 71B and 73B and the terminal wiring part 55B is bent according to the bends 71B and 73B.

The third embodiment provides effects similar to those of the first embodiment. In addition, the third embodiment forms the terminal wiring part 55B entirely with the insulating layer 49*a* and wiring layer 51*a* and extends the same from the flexure main part 46 to the terminal main part 57B, to stabilize the electric characteristics of the terminal 53B and improve the productivity of the same.

Figure 16:
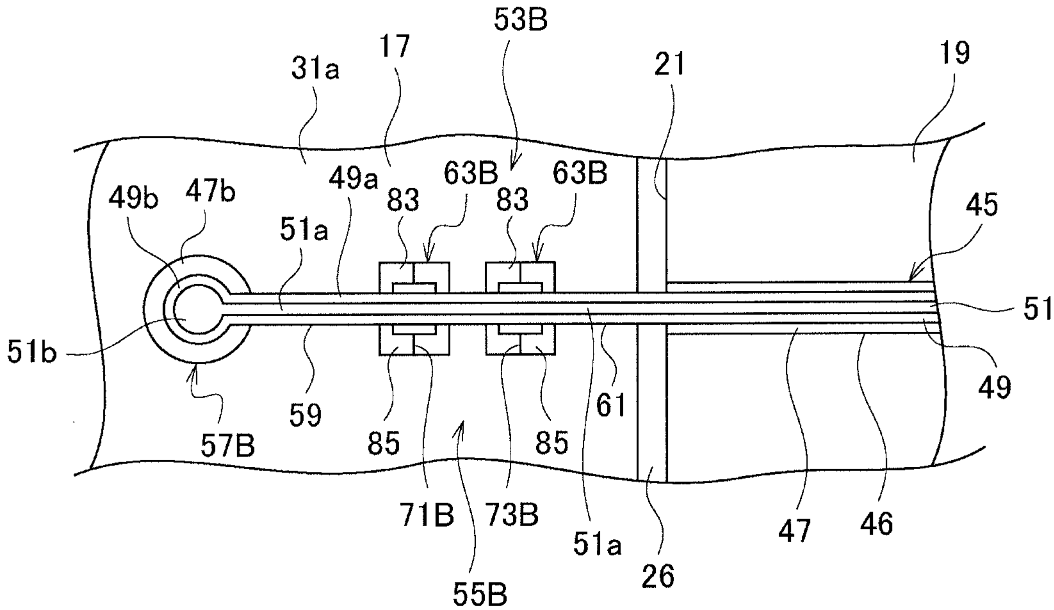
FIG. 16 is a plan view illustrating a terminal of a flexure and the periphery thereof according to a modification of the third embodiment.

FIG. 16 is a plan view illustrating a modification of the third embodiment. This modification forms the pair of terminal benders 63B each into a frame shape.

Namely, each terminal bender 63B has frame parts 83 and 85 that extend in an extending direction of a terminal wiring part 55B and are laterally-located with respect to the insulating layer 49*a* of the terminal wiring part 55B. The frame parts 83 and 85 are plastically bent to form the bend 71B (73B).

This modification provides effects similar to those of the third embodiment. In addition, the modification plastically bends the frame parts 83 and 85, to reduce load to be applied during the bending process onto the insulating layer 49*a* and wiring layer 51*a* of the terminal wiring part 55B.

Figure 17:
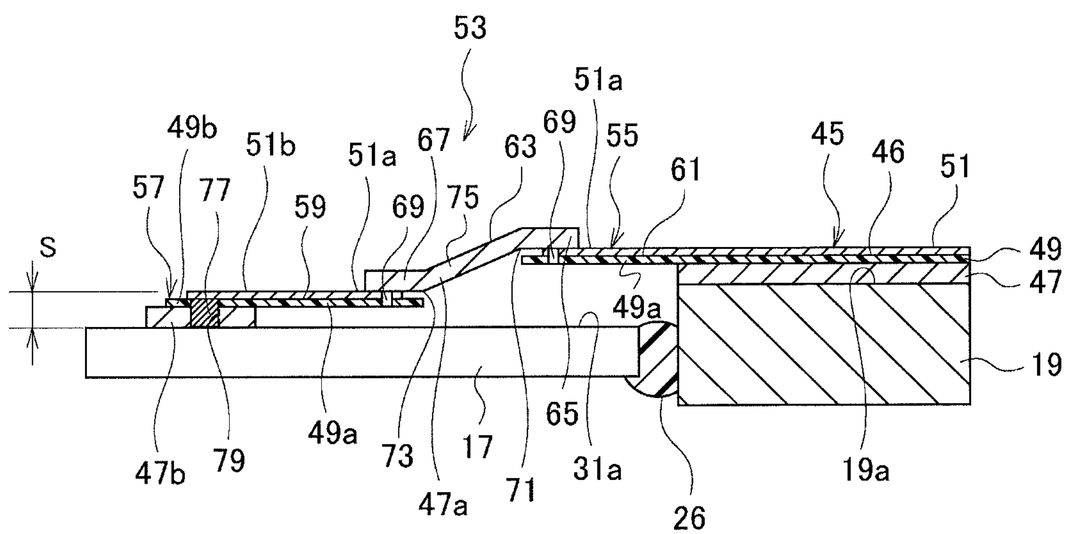
FIG. 17 is a sectional view illustrating a terminal of a flexure and the periphery thereof according to a variation of the present invention.

Although the above-mentioned embodiments and modifications form the terminal bender 63 by partly leaving the supportive metal layer 47 of the flexure 45 when forming the terminal wiring part 55, the present invention is not limited to these embodiments or modifications and allows many alterations and variations. FIG. 17 is a sectional view illustrating one of such variations of the present invention. This variation separately prepares a terminal bender 63 and attaches the same to a wiring layer 51*a* of a terminal wiring part 55 of a terminal 53.

What is claimed is:

1. A terminal comprising:

a terminal wiring part formed to a wiring member that is located on an actuator base on one side in a thickness direction of the actuator base, the actuator base having an opening into which a piezoelectric element is fixed and a surface surrounding the opening on said one side, the piezoelectric element having on said one side an electrode that is recessed relative to said surface of the actuator base in the thickness direction to form a gap, the terminal wiring part extending at least from a portion of the wiring member located on an edge of the opening on said one side in said thickness direction into a region located over the piezoelectric element on said one side in said thickness direction and including an insulating layer and a wiring layer formed on the insulating layer;

a terminal main part formed at a front end of the terminal wiring part and connected to the piezoelectric element that is arranged to face the terminal main part on said one side in said thickness direction; and a terminal bender that is made of a supportive metal layer, wherein the terminal bender is arranged along and attached to a part of the terminal wiring part in said region located over the piezoelectric element on said one side in said thickness direction, and is plastically deformed to form a bend in the part of the terminal wiring part so as to locate the terminal main part closer to the electrode of the piezoelectric element on said one side in said thickness direction relative to said portion of the wiring member positioned on the edge of the opening.

2. The terminal of claim 1, wherein the part of the terminal wiring part is formed by only the terminal bender.

3. The terminal of claim 2, wherein the terminal wiring part is divided into a front wiring part and a rear wiring part, each of the front and rear wiring parts including the insulating layer and wiring layer, and the terminal bender is arranged to connect the front and rear wiring parts to each other.

4. The terminal of claim 1, wherein the terminal wiring part includes one of a front wiring part extending from the terminal main part to an intermediate part of the terminal and a rear wiring part extending from the wiring member to the intermediate part of the terminal, the one of the front and rear wiring parts being made of the insulating layer and wiring layer, and the terminal bender connects the one of the front and rear wiring parts to an opposing one of the wiring member and terminal main part.

5. The terminal of claim 4, wherein the terminal wiring part has the rear wiring part extending from the wiring member to the intermediate part of the terminal, the terminal bender connects the rear wiring part to the terminal main part, and the terminal main part is made of a supportive metal layer that is integral with the terminal bender.

6. The terminal of claim 1, wherein the terminal bender is partly narrowed.

7. The terminal of claim 1, wherein the terminal bender is laid on the insulating layer and wiring layer at the part of the terminal wiring part.

8. The terminal of claim 7, wherein the terminal wiring part is entirely made of the insulating layer and wiring layer between the wiring member and the terminal main part, the terminal bender is laid on the part of the terminal wiring part, and the part of the terminal wiring part bends according to the bend formed by the terminal bender.

9. A wiring member comprising:

the terminal of claim 1; and a wiring member main part having a layered structure at least including a supportive metal layer, an insulating layer formed on the supportive metal layer, and a wiring layer formed on the insulating layer, the terminal wiring part of the terminal extending from the wiring member main part.

10. A head suspension comprising:

the wiring member of claim 9;

a base;

a load beam which is supported with the base and to which the wiring member is attached;

a head formed on the wiring member to read and write data; and the piezoelectric element arranged between the base and the load beam, the piezoelectric element that deforms according to a voltage applied thereto from the wiring member through the terminal, to minutely move the head through the load beam in a sway direction relative to the base.

11. A terminal comprising:

a terminal wiring part extending from a wiring member and including an insulating layer and a wiring layer formed on the insulating layer;

a terminal main part formed at a front end of the terminal wiring part and connected to a piezoelectric element that is arranged to face the terminal main part; and a terminal bender that is made of a supportive metal layer, is arranged along a part of the terminal wiring part in an extending direction thereof, and is plastically deformed to form a bend in the part of the terminal wiring part so as to bring the terminal main part closer to the piezoelectric element, wherein the part of the terminal wiring part is formed by only the terminal bender, and wherein the terminal wiring part is divided into a front wiring part and a rear wiring part, each of the front and rear wiring parts including the insulating layer and wiring layer, and the terminal bender is arranged to connect the front and rear wiring parts to each other.

12. A wiring member comprising:

the terminal of claim 11; and a wiring member main part having a layered structure at least including a supportive metal layer, an insulating layer formed on the supportive metal layer, and a wiring layer formed on the insulating layer, the terminal wiring part of the terminal extending from the wiring member main part.

13. A head suspension comprising:

the wiring member of claim 12;

a base;

a load beam which is supported with the base and to which the wiring member is attached;

a head formed on the wiring member to read and write data; and the piezoelectric element arranged between the base and the load beam, the piezoelectric element that deforms according to a voltage applied thereto from the wiring member through the terminal, to minutely move the head through the load beam in a sway direction relative to the base.

* * * * *